(12) United States Patent
Liu et al.

(10) Patent No.: US 8,350,150 B2
(45) Date of Patent: Jan. 8, 2013

(54) ENCLOSURE OF ELECTRONIC DEVICE

(75) Inventors: Chien-Hung Liu, Taipei Hsien (TW); Po-Chuan Hsieh, Taipei Hsien (TW); Yu-Chang Pai, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 305 days.

(21) Appl. No.: 12/860,941

(22) Filed: Aug. 23, 2010

(65) Prior Publication Data

US 2011/0297413 A1  Dec. 8, 2011

(30) Foreign Application Priority Data

Jun. 7, 2010  (TW) .................................. 99118299

(51) Int. Cl.
*H05K 5/00* (2006.01)

(52) U.S. Cl. ............ 174/50; 174/58; 439/535; 248/906; 361/800

(58) Field of Classification Search ............... 174/50, 174/58; 439/535; 248/906; 220/4.02; 361/800
See application file for complete search history.

(56) References Cited

U.S. PATENT DOCUMENTS

| 6,064,004 A * | 5/2000 | Kunnas | 174/669 |
| 6,417,448 B1 * | 7/2002 | Murphy | 174/51 |
| 6,822,877 B2 * | 11/2004 | Chen | 361/801 |

* cited by examiner

*Primary Examiner* — Dhirubhai R Patel
(74) *Attorney, Agent, or Firm* — Altis Law Group, Inc.

(57) ABSTRACT

An enclosure of an electronic device includes a plate. The plate defines a number of through holes. Each through hole has a pair of tabs connected to each other and with the through hole. Each pair of tabs are slantingly bent towards an inside of the enclosure. The enclosure with the shields can shield the electronic device from electro-magnetic interference.

5 Claims, 5 Drawing Sheets

ENCLOSURE OF ELECTRONIC DEVICE

CROSS-REFERENCE TO RELATED APPLICATIONS

Relevant subject matter is disclosed in the co-pending U.S. patent applications (application Ser. Nos. 12/841,125, 12/849,939, 12/855,903, 12/859,283, 12/868,687, 12/869,709) having the same title and assigned to the same assignee as named herein.

BACKGROUND

1. Technical Field

The present disclosure relates to an enclosure of an electronic device.

2. Description of Related Art

For the enclosure of a typical electronic device, electromagnetic interference (EMI) is a common problem during operation. Commonly, through holes are defined in the enclosure for aiding in heat dissipation, and though sizes and placement of the holes are chosen and arranged to help avoid EMI, problems from EMI still occur.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
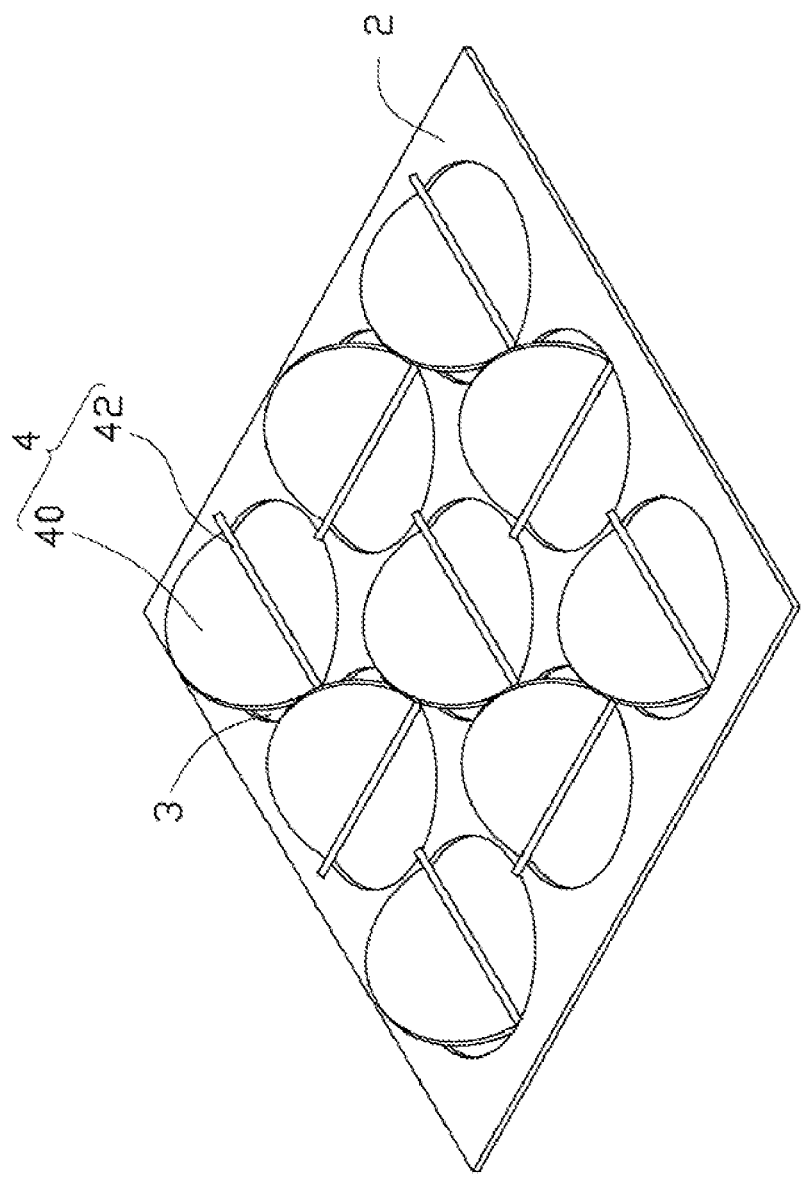
FIG. 1 is an isometric view of a plate in an exemplary embodiment of enclosure of an electronic device.
Figure 2:
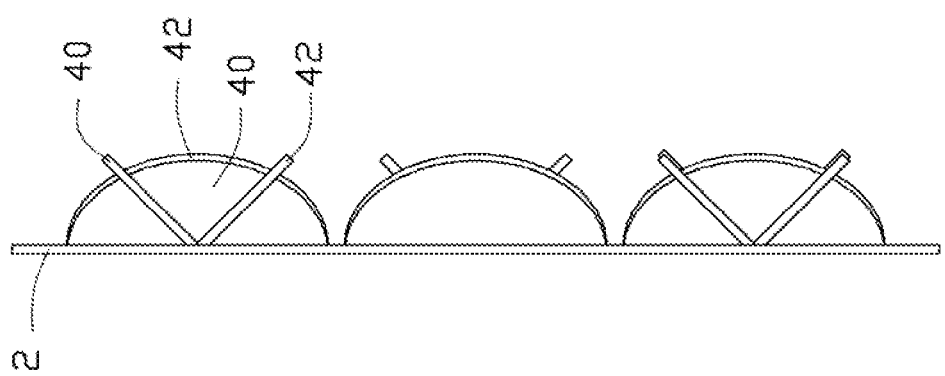
FIG. 2 is a side view of the plate of FIG. 1.

The disclosure, including the accompanying drawings, is illustrated by way of example and not by way of limitation. It should be noted that references to "an" or "one" embodiment in this disclosure are not necessarily to the same embodiment, and such references mean at least one.

Referring to FIGS. 1 to 5, an exemplary embodiment of an enclosure 1 of an electronic device includes a front wall 10, a back wall (not shown), two side walls 15, a bottom wall (not shown), and a top wall 12. A plate 2 can be arranged on any one of the back wall, the two side walls 15, the bottom wall, and the top wall 12. In the embodiment the plate 2 is arranged on the top wall 12 of the enclosure 1.

The plate 2 is quadrate shaped. A plurality of pairs of tabs 40 and 42 are punched in the plate 2. Each pair of tabs includes one tab 40 and one tab 42. Each tab is substantially semicircular, and straight sides of the two tabs are connected together. Each pair of tabs 40 and 42 are slantingly bent towards an outside of the enclosure 1. As a result, a plurality of through holes 3 is formed in the plate 2. Heat inside the enclosure 1 can be vented to the outside through the through holes 3.

From another perspective, the plate 2 defines a plurality of through holes 3, with a plurality of shields 4 partly covering the through holes 3. Each through hole 3 is a round hole. Each shield 4 includes a first tab 40 and a second tab 42 connected to the first tab 40. Each of the first tab 40 and the second tab 42 is substantially semicircular, and has a same radius as the corresponding through hole 3. In other words, a sum of areas of two tabs 40 and 42 in one pair of tabs is equal to an area of the corresponding through hole 3. The first tab 40 and the second tab 42 are connected together at the straight sides of the first and second tabs 40 and 42, with the first and second tabs 40 and 42 angled. The straight sides of the first and second tabs 40 and 42 in every two adjacent through holes 3 are not parallel. In this embodiment, the straight sides of the first and second tabs 40 and 42 in every two adjacent through holes 3 are perpendicular to each other. As a result, heat inside the enclosure 1 can be vented to the outside through the through holes 3.

Figure 3:
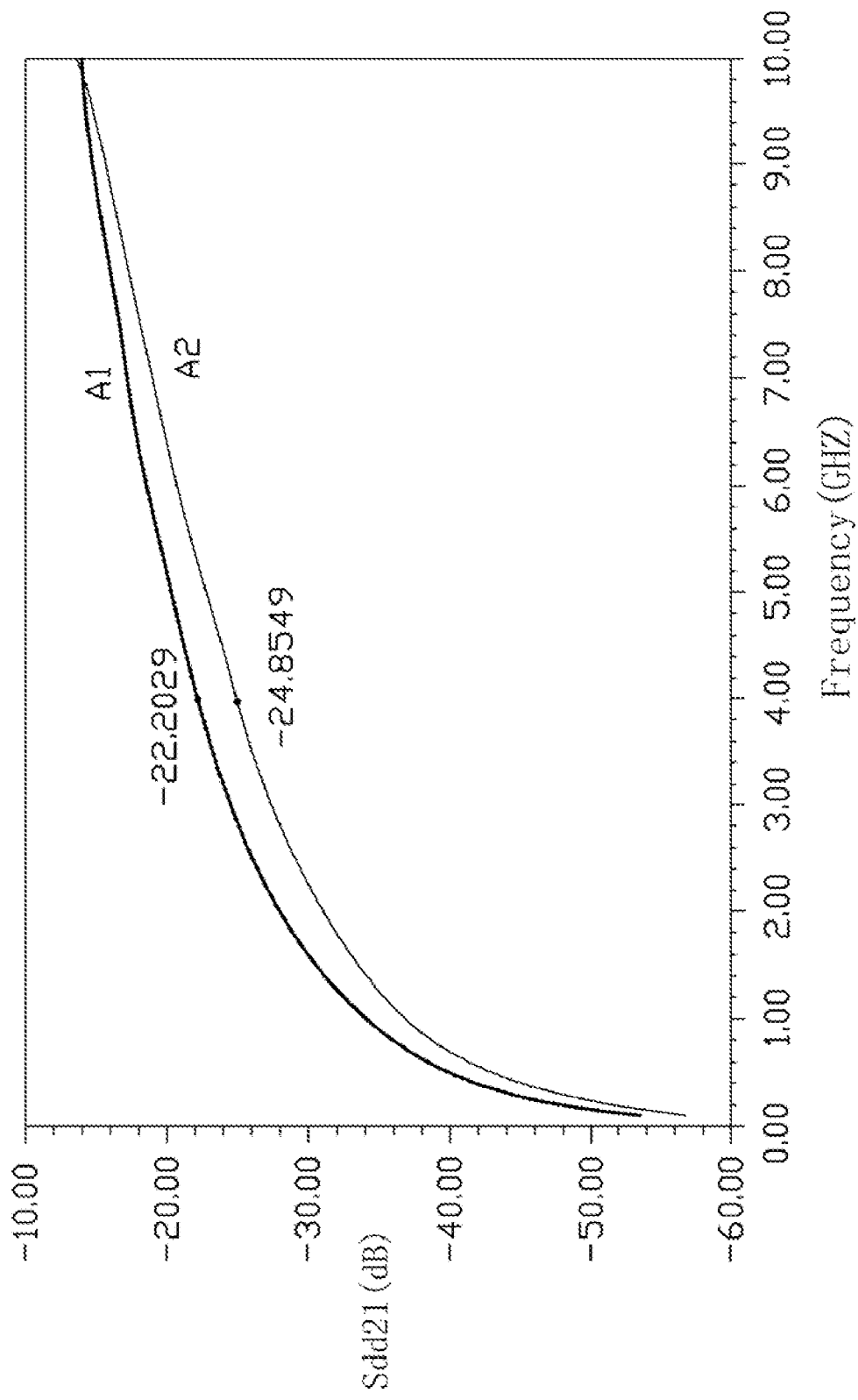
FIG. 3 is a graph showing EMI shielding effectiveness of a conventional enclosure and an enclosure using the plate of FIG. 1.

Referring to FIG. 3, a curve A1 represents EMI shielding effectiveness of a conventional enclosure. A curve A2 represents EMI shielding effectiveness of the enclosure 1 with the plate 2 of FIG. 1. FIG. 3 clearly indicates that the EMI shielding effectiveness of the enclosure 1 with the plate 2 is better than the EMI shielding effectiveness of the conventional enclosure.

Furthermore, in other embodiments, the size and shape of the first tab 40 and the second tab 42 of the shield 4 can be changed according to need. When the shields 4 are configured with a different size and a different shape, the EMI shielding effectiveness of the enclosure 1 may be different. In addition, shape of the through holes 3 need not be round as shown in the figures. Furthermore, in other embodiments, the first tab 40 and the second tab 42 can be pivotably coupled together, thus to change an angle between the first tab 40 and the second tab 42. When the first tab 40 and the second tab 42 have different angle, the EMI shielding effectiveness of the enclosure 1 may be different.

Figure 4:
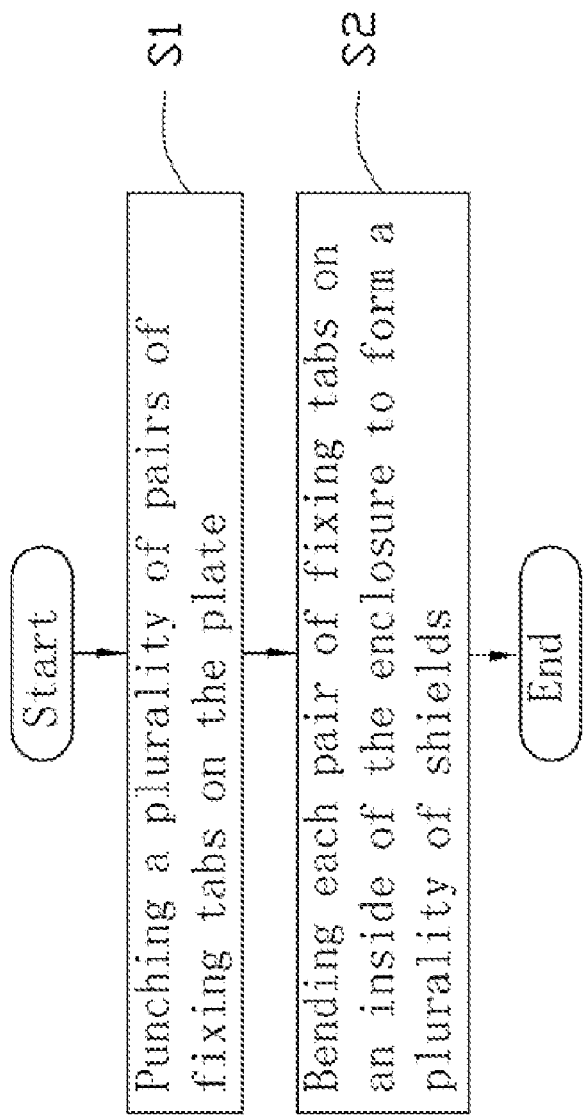
FIG. 4 is a flowchart of an exemplary embodiment of a manufacturing method for the plate of FIG. 1.
Figure 5:
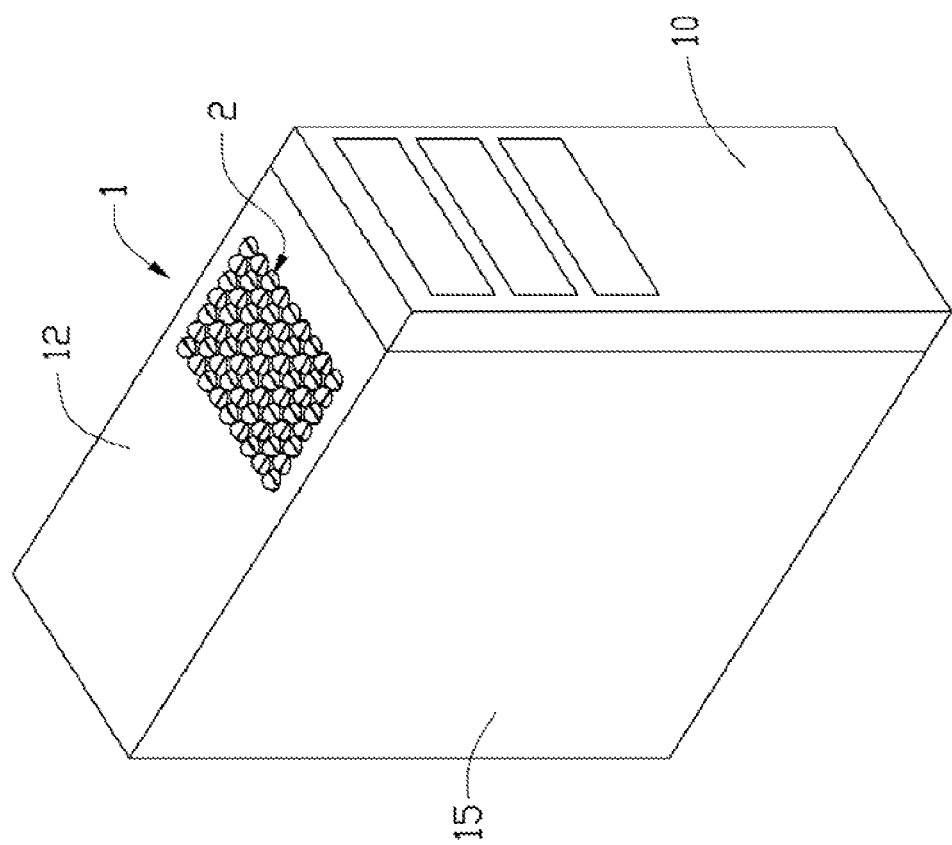
FIG. 5 is an isometric, view of the plate at the enclosure of the electronic device.

Referring to FIG. 4, an exemplary embodiment of a manufacturing method for the plate 2 includes the following steps.

In step S1, a plurality of pairs of tabs is punched in a plate. Each pair of tabs includes two opposite tabs, and each tab is substantially semicircular and straight sides of the pair of tabs are connected together. In one embodiment, the straight sides of adjacent pairs of tabs are made not parallel to each other.

In step S2, each pair of tabs are slantingly bent towards an inside of the enclosure to form the shields 4 and the through holes 3.

The foregoing description of the embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. An enclosure of an electronic device, the enclosure comprising a front wall, a back wall, two side walls, a bottom wall, and a top wall, wherein a plate is arranged at any one of the front wall, the back wall, the two side walls, the bottom wall, and the top wall, and the plate is punched to define a plurality of through holes, each through hole has a pair of tabs, the pair of tabs are connected to each other at a shared side, and the shared side connected with the through hole, a sum of areas of the pair of tabs is equal to an area of a corresponding through hole, and each pair of tabs are slantingly bent towards an outside of the enclosure and disconnected from the plate except the shared side.

2. The enclosure of claim 1, wherein each through hole is a round hole, each tab is substantially semicircular and has a same radius as the corresponding through hole.

3. The enclosure of claim 2, wherein the shared side of each pair of tabs are straight, the straight shared sides of the tabs in every two adjacent through holes are nonparallel.

4. The enclosure of claim 3, wherein the straight shared sides of the tabs in every two adjacent through holes are perpendicular to each other.

5. The enclosure of claim 1, wherein the two tabs are pivotably coupled together.

* * * * *